US006947328B1

(12) United States Patent
Smidt et al.

(10) Patent No.: US 6,947,328 B1
(45) Date of Patent: Sep. 20, 2005

(54) VOLTAGE LEVEL SHIFTER

(75) Inventors: Alec W. Smidt, Folsom, CA (US); Andrew D. Proescholdt, Rancho Cordova, CA (US); Boubekeur Benhamida, El Dorado Hills, CA (US); Ravi Annavajjhala, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/747,802

(22) Filed: Dec. 29, 2003

(51) Int. Cl.[7] .............................................. G11C 16/06
(52) U.S. Cl. .......................... 365/185.23; 365/185.24; 365/185.11
(58) Field of Search ..................... 365/185.23, 185.24, 365/185.11, 189.05, 189.06, 230.06, 230.08

(56) References Cited

U.S. PATENT DOCUMENTS 5,392,253 A * 2/1995 Atsumi et al. ......... 365/230.06
5,784,315 A * 7/1998 Itoh ...................... 365/185.22
6,400,206 B2 * 6/2002 Kim et al. .................. 327/333
6,727,729 B2 * 4/2004 Brooks et al. ................ 326/68
6,819,620 B2 * 11/2004 Lin et al. .................... 365/227

* cited by examiner

*Primary Examiner*—Gene N. Auduong
(74) *Attorney, Agent, or Firm*—Troutman Sanders LLP; James E. Schutz

(57) ABSTRACT

A high-speed voltage level shifter. A transistor (10) may be connected to high voltage (VPP) and may act as a source of a limited current to a first node (21), and a driver (14, 15) connected to the first node may provide a level-shifted output signal (VOUT) to a memory control input line of a memory cell (6). A plurality of series-connected transistors (12A–12N) may be connected between a second node (22A) and a circuit ground, each transistor may have an input connected to a corresponding control signal (VIN-A to VIN-N) from a control circuit (5). A transistor (11) may be connected between the first node and the second node in a source-follower configuration and may have an input connected to a bias voltage (VBIAS) which may limit the voltage at node 22A, so transistors 12A–12N may be low-voltage, high speed transistors.

44 Claims, 1 Drawing Sheet

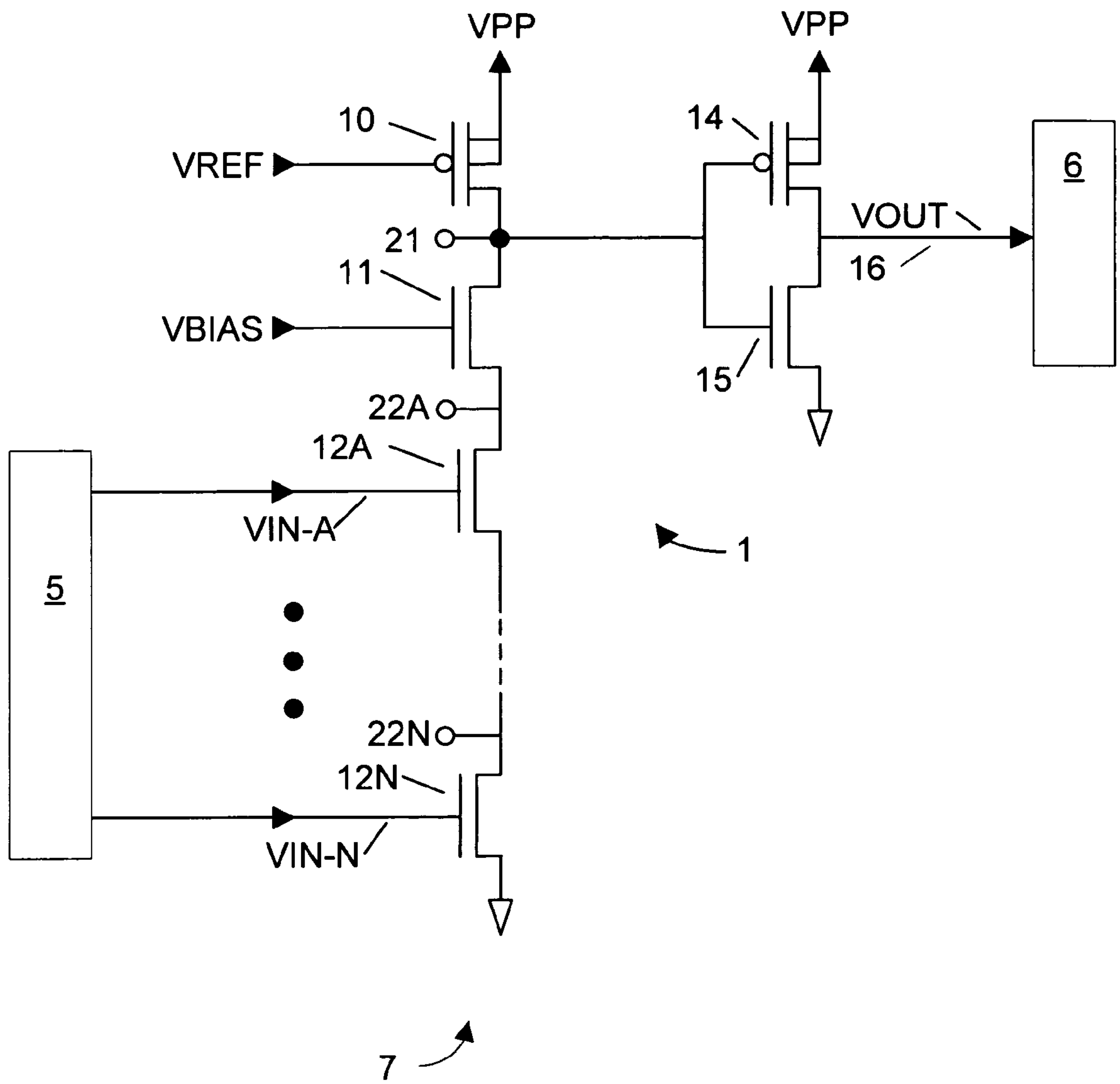
VPP
VPP
10
14
VREF
6
VOUT
21
11
16
VBIAS
15
22A
12A
VIN-A
1
5
22N
12N
VIN-N
7

VOLTAGE LEVEL SHIFTER

BACKGROUND

In order to perform read, program and erase operations in Flash memory, it is generally necessary to apply high voltages (higher than the typical control logic VCC supply) to the Flash cell. However, consumers are demanding higher speeds and lower power consumption. Higher speeds, of course, typically require faster transistors. One technique for designing and manufacturing faster transistors may be to decrease the distance between the transistor gate and the drain. However, this may create a high voltage overstress problem. As the distance between the gate and the drain diffusion decreases the maximum operating voltage of the transistor may decrease. If the distance is too small the silicon barrier between the gate and drain may have an excessive leakage current or may break down completely. Conversely, if the power supply voltage is lowered then the transistors may be made smaller and faster.

Also, if the operating voltage is decreased by some factor but the current drawn by the transistor does not increase by more than that factor, then the power consumption may decrease or at least not increase.

Therefore, making smaller transistors generally results in faster transistors and reduced power consumption. However, a Flash memory typically requires a high voltage to program, read and erase the Flash memory cell. Therefore, a level shifter circuit may be used to interface between the low voltage requirements of the control circuitry and the high voltage requirements of the Flash memory cell.

A level shifter typically takes a low voltage input, usually a logical voltage, and level shifts it to a high voltage. Two primary types of level shifters are currently in use. The traditional level shifter uses a cross-coupled P-devices formation. This type of level shifter is typically the fastest and consumes the least power. A ratioed logic level shifter is smaller but consumes more power than the traditional level shifter.

However, a problem may arise when using conventional level shifters between the low voltage, fast transistor logic circuitry and a high voltage Flash memory: the level shifters are in the control path for the Flash memory and, if made entirely of high voltage devices, may be slower. This adversely impacts the memory read, write and erase times, and therefore may adversely impact product performance.

BRIEF DESCRIPTION OF THE DRAWING

The FIGURE is a schematic diagram of an embodiment of the present invention.

DETAILED DESCRIPTION

Turn now to the FIGURE, which is a schematic diagram of an exemplary embodiment of the present invention. An exemplary environment of the present invention is in conjunction with a Flash memory device 7 having low-voltage, high speed logic circuits 5 and Flash-type memory cells 6. However, the present invention may be used in conjunction with low-voltage circuits and high-voltage circuits in general. In the exemplary environment, the exemplary embodiment may be internal to a Flash memory device 7 and may be interposed between a low voltage, high speed logic control circuit 5 and one or more Flash memory cells 6. The control circuit 5 may read and/or may write to the memory cell 6 and, as such, typically may comprise a high speed decoding circuit, which may include, for example, a microprocessor. Whereas the logic circuit 5 generally requires a "low" operating voltage of 1 to 5 volts, depending upon the technology, the Flash memory 6 typically requires a "high" operating voltage, typically 8 to 11 volts, and even higher voltages, e.g., 20 volts, for some technologies.

A Flash memory device 7 may comprise a plurality of Flash memory cells 6, arranged in rows and columns. A particular cell may be selected by activating a row control line and a column control line. Typically, a plurality of cells may be associated to form a logical word, which may be of any convenient length, 16 bits, 32 bits, 64 bits, etc. The logical word may then be accessed by activating the row control line for that word, and activating all of the column lines. A row control line is often referred to as a wordline.

In the exemplary environment the Flash memory device 7 may have a plurality of words and wordlines and, therefore, a plurality of the level shifter circuit 1 may be used, one for each wordline.

The circuit 5 may provide a plurality of output signals VIN-A through VIN-N which may be used to select the particular wordline 16. Signals VIN-A through VIN-N may be connected to the gates of N-type transistors 12A–12N, respectively. Transistors 12A–12N may be low to ultra-low voltage, high speed transistors, and may be connected in series. Interposed between the drain of transistor 12A and the operating supply voltage VPP may be the series combination of a P-channel metal oxide semiconductor (P-type) transistor 10 and an N-channel metal oxide semiconductor (N-type) transistor 11. The signal VREF may be connected to the gate of transistor 10 so as to weakly bias it on. Transistor 10 may therefore function as, or may be considered to be, a weak or limited constant current source, or a current-limiting resistor. The signal VBIAS may be used to control the operation of transistor 11 and may also serve to assist in providing the benefits described herein. Transistor 11 may be used in a source-follower mode of operation but its pull-up capability may be limited by the limited current supplied by transistor 10. Transistors 10, 11, 14 and 15 may be high voltage, high speed transistors.

Consider first the situation where all the signals VIN-A through VIN-N are a logical one or "on". All of transistors 12A–12N may be turned on. Due to the limited current available from transistor 10, transistor 11 may not be able to source enough current to maintain the voltage at node 22A, so the voltages at nodes 22A–22N may be low. As the voltage at node 22A may be low, and the current-sourcing capability of transistor 10 may be limited, transistor 11 may pull down the output of transistor 10, so the voltage at node 21 may be low.

Node 21 may be connected to the gates of the series combination of P-type transistor 14 and N-type transistor 15, which may function as an inverter or inverting driver. The source of transistor 14 may be connected to VPP, the source of transistor 15 may be connected to circuit ground, and the drain of transistor 14 and the drain of transistor 15 may be connected together and to the VOUT output signal line 16. Thus, when node 21 is low, transistor 14 may be turned on, transistor 15 may be turned off, and the VOUT output signal line 16 may be pulled to VPP by transistor 14, thereby selecting that word line 16.

Consider now the situation where at least one of the signals VIN-A through VIN-N may be a logical zero or "off". For convenience of discussion, assume that signal VIN-A may be off, and the other VIN signals may be on. Transistor 12A may be off, so the series combination of transistors 12A–12N may represent an open circuit, and may not sink any current. Thus, if transistor 11 were not present (i.e., replaced by a source-drain short) then transistor 10 may pull nodes 21 and 22A up to VPP, and the full high voltage VPP may be impressed across transistor 12A. If transistor 12A is a low-voltage device, then it may be destroyed. Therefore, without transistor 11, transistors 12A–12N may have to be high-voltage devices, which may require them to be slower, larger, higher-power and/or more expensive devices. Further, these high-voltage transistors may, as a consequence, have a higher turn-on threshold voltage (Vt) which may approach or even exceed the maximum output voltage of some ultra-low voltage technologies. As Vt may vary depending upon the process and upon the operating temperature, the operation of these high-voltage transistors may become slow, erratic, or even non-functional.

However, if transistor 11 is present, and is used in a source-follower mode, then the node 22A may only be allowed to rise to VBIAS-VT11, where VT11 is the gate-source turn-on voltage of transistor 11. Thus, the maximum voltage that may be impressed across transistor 12A is VBIAS-VT11. Therefore, transistors 12A–12N may be low-voltage devices, and therefore may be smaller, faster, lower-power and/or less expensive devices without sacrificing speed. As a result of at least one transistors 12A–12N being off, transistor 10 may pull node 21 to VPP, thereby turning off transistor 14, and turning on transistor 15, which may cause the VOUT output signal line 16 to be low, thereby deselecting that word line 16.

VPP may be provided from a selectable voltage power supply and may vary from zero volts to 12 volts, VBIAS may be 2 volts, VREF may be zero volts, VIN-A through VIN-N may be zero to 1 volt (logic signals), the voltage at node 21 may vary from zero volts to VPP, and the voltage at nodes 22A–22N may vary from zero volts to VBIAS-VT11. These voltages are not critical. Furthermore, if a negative supply voltage (VSS) is used rather than circuit ground, then the lower voltages may change accordingly, e.g., the voltage at node 21 may vary from VSS to VPP.

In theory, the metal oxide semiconductor (MOS) transistors 11, 12A–12N, 14 and 15 may require no drive current and the current provided by transistor 10 may be extremely small or even zero. However, in actual practice, transistors may have leakage currents. Therefore, the current provided by transistor 10 must be at least sufficient to turn on transistor 15 and turn off transistor 14. Further, there may be a capacitance associated with the gate of transistors 14 and 15, so the current provided by transistor 10 must also be at least sufficient to charge or discharge these capacitances quickly enough to achieve the desired switching speed. Similarly, transistors 11 and 12A–12N must be able to sink enough of the current from transistor 10 to turn on transistor 14 and turn off transistor 15. Further, because of the capacitance mentioned above and associated with the gate of transistors 14 and 15, the current sunk by transistors 11 and 12A–12N must also be at least sufficient to charge or discharge these capacitances quickly enough to achieve the desired switching speed. However, the larger the current provided by transistor 10, the larger the power consumption, so the maximum current provided by transistor 10 is a design choice.

Although the exemplary environment is in a Flash memory, the present invention is not so limited and may be used in any situation where a voltage-level shifting circuit using lower-voltage devices is desired or required. For example, an embodiment may be used for voltage-level shifting between different technologies or where it is desired to interface two devices which operate under different standards. Also, although the exemplary embodiment contemplates two or more input signals VIN and, therefore, a corresponding number of transistors 12, an embodiment may also be used where there is only one input signal VIN-A and one corresponding transistor 12A. In addition, the use of transistors 14 and/or 15 may not be necessary in some situations, and the signal at node 21 may be used as the output signal. Further, although transistors 14 and 15 have been described in an inverting configuration, they may also be connected in a non-inverting configuration. Finally, although semiconductor devices 10, 11, 12, 14 and 15 have been described herein as P-channel or N-channel metal oxide semiconductors, other semiconductor types, although possibly less favored because of power consumption, heat generation, size, and other factors, may also be used, for example, bipolar transistors.

While an exemplary embodiment and its exemplary environment have been described above and shown in the accompanying drawing, the present invention is not so limited as various modifications may occur to those of ordinary skill in the art upon reading this disclosure. The scope of the invention should, therefore, be determined with reference to the appended claims, along with the full scope of equivalents to which such claims are entitled.

We claim:

1. A circuit, comprising:

a source of a limited current connected between a power source and a first node;

a first semiconductor device having an input connected to a bias voltage, and being connected between the first node and a second node to provide a level-shifted output signal at the first node; and a second semiconductor device, having an input connected to an input signal, and having an output connected to the second node, the second semiconductor device being a low-voltage device.

2. The circuit of claim 1 wherein the source of a limited current is a semiconductor device which performs as a weak current source.

3. The circuit of claim 1 wherein the source of a limited current is connected to a predetermined voltage, wherein the first semiconductor device is rated to withstand the predetermined voltage, and wherein the second semiconductor device is not rated to withstand the predetermined voltage.

4. The circuit of claim 1 wherein the first semiconductor device is a metal oxide semiconductor transistor connected in a source-follower configuration.

5. The circuit of claim 1 wherein the first semiconductor device is a metal oxide semiconductor transistor having a gate, a drain, and a source, the gate being the input connected to the bias voltage, the drain being connected to the first node, and the source being connected to the second node.

6. A circuit, comprising:

a source of a limited current connected between a power source and a first node;

a first semiconductor device having an input connected to a bias voltage, and being connected between the first node and a second node to provide an output signal at the first node;

a second semiconductor device, having an input connected to an input signal, and having an output connected to the second node, wherein the second semiconductor is a low-voltage device; and a driver having an input connected to the first node and having an output to provide a level-shifted output signal.

7. The circuit of claim 6 wherein the source of a limited current is a semiconductor device which performs as a weak current source.

8. The circuit of claim 6 wherein the source of a limited current is connected to a predetermined voltage, wherein the first semiconductor device is rated to withstand the predetermined voltage, and wherein the second semiconductor device is not rated to withstand the predetermined voltage.

9. The circuit of claim 6 wherein the source of a limited current is connected to a predetermined voltage, wherein the first semiconductor device and the driver are rated to withstand the predetermined voltage, and wherein the second semiconductor device is not rated to withstand the predetermined voltage.

10. The circuit of claim 6 wherein the first semiconductor device is a metal oxide semiconductor transistor connected in a source-follower configuration.

11. The circuit of claim 6 wherein the first semiconductor device is a metal oxide semiconductor transistor having a gate, a drain, and a source, the gate being the input connected to the bias voltage, the drain being connected to the first node, and the source being connected to the second node.

12. A circuit, comprising:

a source of a limited current connected between a power source and a first node;

a first semiconductor device having an input connected to a bias voltage, and being connected between the first node and a second node to provide a level-shifted output signal at the first node; and a plurality of second semiconductor devices, the plurality being in a series-connected configuration, one end of the plurality being connected to the second node, each second semiconductor device of the plurality of second semiconductor devices having an input connected to a corresponding one of a plurality of input signals, and each second semiconductor device being a low-voltage device.

13. The circuit of claim 12 wherein the source of a limited current is a semiconductor device which performs as a weak current source.

14. The circuit of claim 12 wherein the source of a limited current is connected to a predetermined voltage, wherein the first semiconductor device is rated to withstand the predetermined voltage, and wherein at least one second semiconductor device of the plurality of second semiconductor devices is not rated to withstand the predetermined voltage.

15. The circuit of claim 12 wherein the first semiconductor device is a metal oxide semiconductor transistor connected in a source-follower configuration.

16. The circuit of claim 12 wherein the first semiconductor device is a metal oxide semiconductor transistor having a gate, a drain, and a source, the gate being the input connected to the predetermined voltage, the drain being connected to the first node, and the source being connected to the second node.

17. A circuit, comprising:

a source of a limited current connected to a first node;

a first semiconductor device having an input connected to a bias voltage, and being connected between the first node and a second node;

a plurality of second semiconductor devices, the plurality being in a series-connected configuration, one end of the plurality being connected to the second node, each second semiconductor device of the plurality of second semiconductor devices having an input connected to a corresponding one of a plurality of input signals, each second semiconductor device being a low-voltage device; and a driver, having an input connected to the first node, and having an output to provide a level-shifted output signal.

18. The circuit of claim 17 wherein the source of a limited current is a semiconductor device which performs as a weak current source.

19. The circuit of claim 17 wherein the source of a limited current is connected to a predetermined voltage, wherein the first semiconductor device is rated to withstand the predetermined voltage, and wherein at least one second semiconductor device of the plurality of second semiconductor devices is not rated to withstand the predetermined voltage.

20. The circuit of claim 17 wherein the source of a limited current is connected to a predetermined voltage, wherein the first semiconductor device and the driver are rated to withstand the predetermined voltage, and wherein at least one second semiconductor device of the plurality of second semiconductor devices is not rated to withstand the predetermined voltage.

21. The circuit of claim 17 wherein the first semiconductor device is a metal oxide semiconductor transistor connected in a source-follower configuration.

22. The circuit of claim 17 wherein the first semiconductor device is a metal oxide semiconductor transistor having a gate, a drain, and a source, the gate being the input connected to the predetermined voltage, the drain being connected to the first node, and the source being connected to the second node.

23. A memory, comprising:

a control circuit to provide a first signal, the first signal having a first voltage;

a source of a limited current connected between a power source and a first node;

a first semiconductor device having an input connected to a bias voltage, and being connected between the first node and a second node to provide a second signal at the first node, the second signal having a second voltage, the second voltage being greater than the first voltage;

a second semiconductor device, having an input connected to the control circuit and responsive to the first signal from the control circuit, and having an output connected to the second node, the second semiconductor device being a low-voltage device; and a memory cell responsive to the second signal.

24. The memory of claim 23 wherein the source of a limited current is a semiconductor device which performs as a weak current source.

25. The memory of claim 23 wherein the source of a limited current is connected to a predetermined voltage, wherein the first semiconductor device is rated to withstand the predetermined voltage, and wherein the second semiconductor device is not rated to withstand the predetermined voltage.

26. The memory of claim 23 wherein the first semiconductor device is a metal oxide semiconductor transistor connected in a source-follower configuration.

27. The memory of claim 23 wherein the first semiconductor device is a metal oxide semiconductor transistor having a gate, a drain, and a source, the gate being the input connected to the predetermined voltage, the drain being connected to the first node, and the source being connected to the second node.

28. A memory, comprising:

a control circuit to provide a first signal, the first signal having a first voltage;

a source of a limited current connected between a power source and a first node;

a first semiconductor device having an input connected to a bias voltage, being connected between the first node and a second node;

a second semiconductor device, having an input connected to the control circuit and responsive to the first signal from the control circuit, and having an output connected to the second node, the second semiconductor device being a low-voltage device; and a driver having an input connected to first node and an output to provide a second signal, the second signal having a second voltage, the second voltage being greater than the first voltage; and a memory cell responsive to a second signal.

29. The memory of claim 28 wherein the source of a limited current is a semiconductor device which performs as a weak current source.

30. The memory of claim 28 wherein the source of a limited current is connected to a predetermined voltage, wherein the first semiconductor device is rated to withstand the predetermined voltage, and wherein the second semiconductor device is not rated to withstand the predetermined voltage.

31. The memory of claim 28 wherein the source of a limited current is connected to a predetermined voltage, wherein the first semiconductor device and the driver are rated to withstand the predetermined voltage, and wherein the second semiconductor device is not rated to withstand the predetermined voltage.

32. The memory of claim 28 wherein the first semiconductor device is a metal oxide semiconductor transistor connected in a source-follower configuration.

33. The memory of claim 28 wherein the first semiconductor device is a metal oxide semiconductor transistor having a gate, a drain, and a source, the gate being the input connected to the predetermined voltage, the drain being connected to the first node, and the source being connected to the second node.

34. A memory, comprising:

a control circuit to provide a plurality of first signals, at least one signal of the plurality of first signals having a first voltage;

a source of a limited current connected between a power source and a first node;

a first semiconductor device having an input connected to a bias voltage, and being connected between the first node and a second node to provide a second signal at the second node, the second signal having a second voltage, the second voltage being greater than the first voltage;

a plurality of second semiconductor devices, the plurality being in a series-connected configuration, one end of the plurality being connected to the second node, each second semiconductor device of the plurality of second semiconductor devices having an input connected to a corresponding first signal of the plurality of first signals, each second semiconductor device being a low-voltage device; and a memory cell responsive to a second signal.

35. The memory of claim 34 wherein the source of a limited current is a semiconductor device which performs as a weak current source.

36. The memory of claim 34 wherein the source of a limited current is connected to a predetermined voltage, wherein the first semiconductor device is rated to withstand the predetermined voltage, and wherein at least one second semiconductor device of the plurality of second semiconductor device is not rated to withstand the predetermined voltage.

37. The memory of claim 34 wherein the first semiconductor device is a metal oxide semiconductor transistor connected in a source-follower configuration.

38. The memory of claim 34 wherein the first semiconductor device is a metal oxide semiconductor transistor having a gate, a drain, and a source, the gate being the input connected to the predetermined voltage, the drain being connected to the first node, and the source being connected to the second node.

39. A memory, comprising:

a control circuit to provide a plurality of first signals, at least one signal of the plurality of first signals having a first voltage;

a source of a limited current connected between a power source and a first node;

a first semiconductor device having an input connected to a bias voltage, and being connected between the first node and a second node;

a plurality of second semiconductor devices, the plurality being in a series-connected configuration, one end of the plurality being connected to the second node, each second semiconductor device of the plurality of second semiconductor devices having an input connected to a corresponding first signal of the plurality of first signals, each second semiconductor device being a low-voltage device;

a driver having an input connected to first node and an output to provide the second signal, the second signal having a second voltage, the second voltage being greater than the first voltage; and a memory cell responsive to the second signal.

40. The memory of claim 39 wherein the source of a limited current is a semiconductor device which performs as a weak current source.

41. The memory of claim 39 wherein the source of a limited current is connected to a predetermined voltage, wherein the first semiconductor device is rated to withstand the predetermined voltage, and wherein at least one second semiconductor device of the plurality of second semiconductor devices is not rated to withstand the predetermined voltage.

42. The memory of claim 39 wherein the source of a limited current is connected to a predetermined voltage, wherein the first semiconductor device and the driver are rated to withstand the predetermined voltage, and wherein at least one second semiconductor device of the plurality of second semiconductor devices is not rated to withstand the predetermined voltage.

43. The memory of claim 39 wherein the first semiconductor device is a metal oxide semiconductor transistor connected in a source-follower configuration.

44. The memory of claim 39 wherein the first semiconductor device is a metal oxide semiconductor transistor having a gate, a drain, and a source, the gate being the input connected to the predetermined voltage, the drain being connected to the first node, and the source being connected to the second node.

* * * * *